(12) United States Patent
Chang et al.

(10) Patent No.: US 9,360,755 B2
(45) Date of Patent: Jun. 7, 2016

(54) THICKENING PHASE FOR SPIN COATING PROCESS

(71) Applicant: Taiwan Semiconductor Manufacturing Company Limited, Hsin-Chu (TW)

(72) Inventors: Chun-Wei Chang, Tainan (TW); Chia-Chieh Lin, Kaohsiung (TW); Chih-Chien Wang, Changhua (TW); Wang-Pen Mo, Pingtung (TW); Hung-Chang Hsieh, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 252 days.

(21) Appl. No.: 13/828,694

(22) Filed: Mar. 14, 2013

(65) Prior Publication Data

US 2014/0272704 A1    Sep. 18, 2014

(51) Int. Cl.
*B05D 3/12* (2006.01)
*G03F 7/16* (2006.01)
*H01L 21/67* (2006.01)
*B05D 1/00* (2006.01)

(52) U.S. Cl.
CPC ............... *G03F 7/168* (2013.01); *G03F 7/162* (2013.01); *H01L 21/6715* (2013.01); *B05D 1/005* (2013.01)

(58) Field of Classification Search
CPC ..... G03F 7/162; G03F 7/168; H01L 21/7615; H01L 21/6715; B05D 1/005
USPC ............. 427/240, 425; 438/780, 782; 118/52, 118/320
See application file for complete search history.

(56) References Cited

U.S. PATENT DOCUMENTS

| 5,939,139 | A * | 8/1999 | Fujimoto | 427/240 |
| 6,228,561 | B1 * | 5/2001 | Hasebe et al. | 430/311 |
| 6,407,009 | B1 * | 6/2002 | You et al. | 438/782 |
| 8,906,452 | B1 * | 12/2014 | Hillman | 427/240 |
| 2008/0057194 | A1 * | 3/2008 | Tanaka | 427/240 |

FOREIGN PATENT DOCUMENTS

| JP | 5-259061 | 10/1993 |
| TW | 201103649 A1 | 2/2011 |

OTHER PUBLICATIONS

Mack, Chris, "Semiconductor Lithography (Photolithography)—The Basic Process", Mar. 4, 2006, pp. 1-12, http://www.lithoguru.com/scientist/lithobasics.html.
Corresponding Chinese Application, Chinese Office action dated Apr. 13, 2016, 9 pages.

* cited by examiner

*Primary Examiner* — Kirsten Jolley
(74) *Attorney, Agent, or Firm* — Cooper Legal Group, LLC

(57) ABSTRACT

Among other things, one or more techniques and systems for performing a spin coating process associated with a wafer and for controlling thickness of a photoresist during the spin coating process are provided. In particular, a thickening phase is performed during the spin coating process in order to increase a thickness of the photoresist. For example, air temperature of down flow air, flow speed of the down flow air, and heat temperature of heat supplied towards the wafer are increased during the thickening phase. The increase in down flow air and heat increase a vaporization factor of the photoresist, which results in an increase in viscosity and thickness of the photoresist. In this way, the wafer can be rotated at relatively lower speeds, while still attaining a desired thickness. Lowering rotational speed of wafers allows for relatively larger wafers to be stably rotated.

20 Claims, 7 Drawing Sheets

THICKENING PHASE FOR SPIN COATING PROCESS

BACKGROUND

Lithography generally refers to processes for transferring one or more patterns between various media. In lithography, a light sensitive resist coating is formed over one or more layers to which a pattern is to be transferred. The resist coating is then patterned by exposing it to one or more types of radiation or light that (selectively) passes through an intervening mask containing the pattern. The light causes exposed or unexposed portions of the resist coating to become more or less soluble, depending on the type of resist used (positive or negative). A developer is then used to remove the more soluble areas leaving the patterned resist. The patterned resist can then serve as a template for the underlying layer or layers which can be selectively etched (or doped or otherwise treated). Once the underlying layer is treated, the patterned resist is removed, such as chemically stripped, thus leaving the treated layer having the pattern formed therein.

SUMMARY

This summary is provided to introduce a selection of concepts in a simplified form that are further described below in the detailed description. This summary is not intended to identify key factors or essential features of the claimed subject matter, nor is it intended to be used to limit the scope of the claimed subject matter.

One or more systems and techniques for performing a spin coating process associated with a wafer or for controlling thickness of photoresist during wafer processing, such as the spin coating process, are provided herein. During lithography patterning, a spin coating process is used to apply a photoresist onto a wafer. For example, photoresist is dispensed onto the wafer, and the wafer is rotated so that the photoresist is distributed across a surface of the wafer according to a target thickness. The speed of rotating the wafer is adjusted to control the thickness of the photoresist. Because a relatively large wafer cannot be spun stably at relatively fast speeds due to tangential velocity at a wafer edge of the wafer, multiple types of photoresists having varying viscosities, which can affect thickness of the photoresist, are used to cover various ranges of photoresist thickness specified for one or more masks used during fabrication. Accordingly, heat and down flow air are used to control thickness of the photoresist so that the photoresist can be used for a larger range of target thicknesses regardless of wafer size because thickness can be controlled by temperature or down flow air as opposed to merely from rotational speed of the wafer. In particular, an increase in temperature can increase a vaporization factor of the photoresist, thus resulting in an increased viscosity of the photoresist. The increased viscosity can increase thickness of the photoresist. In this way, increased heat or down air flow are used to control thickness of the photoresist during a thickening phase or other phases of the spin coating process.

In some embodiments, a spin coating process includes one or more phases, such as a resist reduction coating phase of a first solvent, a dispense phase of a photoresist onto a wafer, a thickening phase that increases a vaporization factor of the photoresist using heat or air to increase a viscosity or thickness of the photoresist, a main wafer spin phase that rotates the wafer according to a uniform thickness metric, or an edge bead rinse of a second solvent to wash out at least a portion of the photoresist along a wafer edge of the wafer. An air flow device is configured to supply down flow air substantially towards a top portion of the wafer during one or more phases according to air settings for respective phases. For example, the air flow device provides down flow air according to a baseline temperature or a baseline flow speed during the dispense phase based upon a dispense phase air setting. During a heating portion of the thickening phase, the air flow device provides the down flow air according to an increased temperature or an increase flow speed based upon a first thickening phase air setting. In this way, the down flow air is supplied at particular temperatures or flow speeds according to air settings for respective phases of the spin coating process. A heat device is configured to supply heat substantially towards a bottom portion of the wafer during one or more phases according to heat settings for respective phases. For example, the heat device provides heat, such as at a baseline heat temperature, during the dispense phase based upon a dispense phase heat setting. During the heating portion of the thickening phase, the heat device provides the heat according to an increased heat temperature based upon a first thickening phase heat setting. In an example, during a cooling portion of the thickening phase, the air flow device can modify or maintain the down flow air based upon a second thickening phase air setting. In another example, during the cooling portion of the thickening phase, the heat device can modify or maintain the heat based upon a second thickening phase heat setting. In this way, the air flow device and the heat device can control thickness of the photoresist during one or more phases of the spin coating process so that a photoresist having a particular initial viscosity can be used for a relatively larger range of thicknesses. In this way, a relatively smaller number of photoresists, having various viscosities, can be used to generate one or more masks for lithography.

The following description and annexed drawings set forth certain illustrative aspects and implementations. These are indicative of but a few of the various ways in which one or more aspects can be employed. Other aspects, advantages, and novel features of the disclosure will become apparent from the following detailed description when considered in conjunction with the annexed drawings.

DETAILED DESCRIPTION

Figure 1:
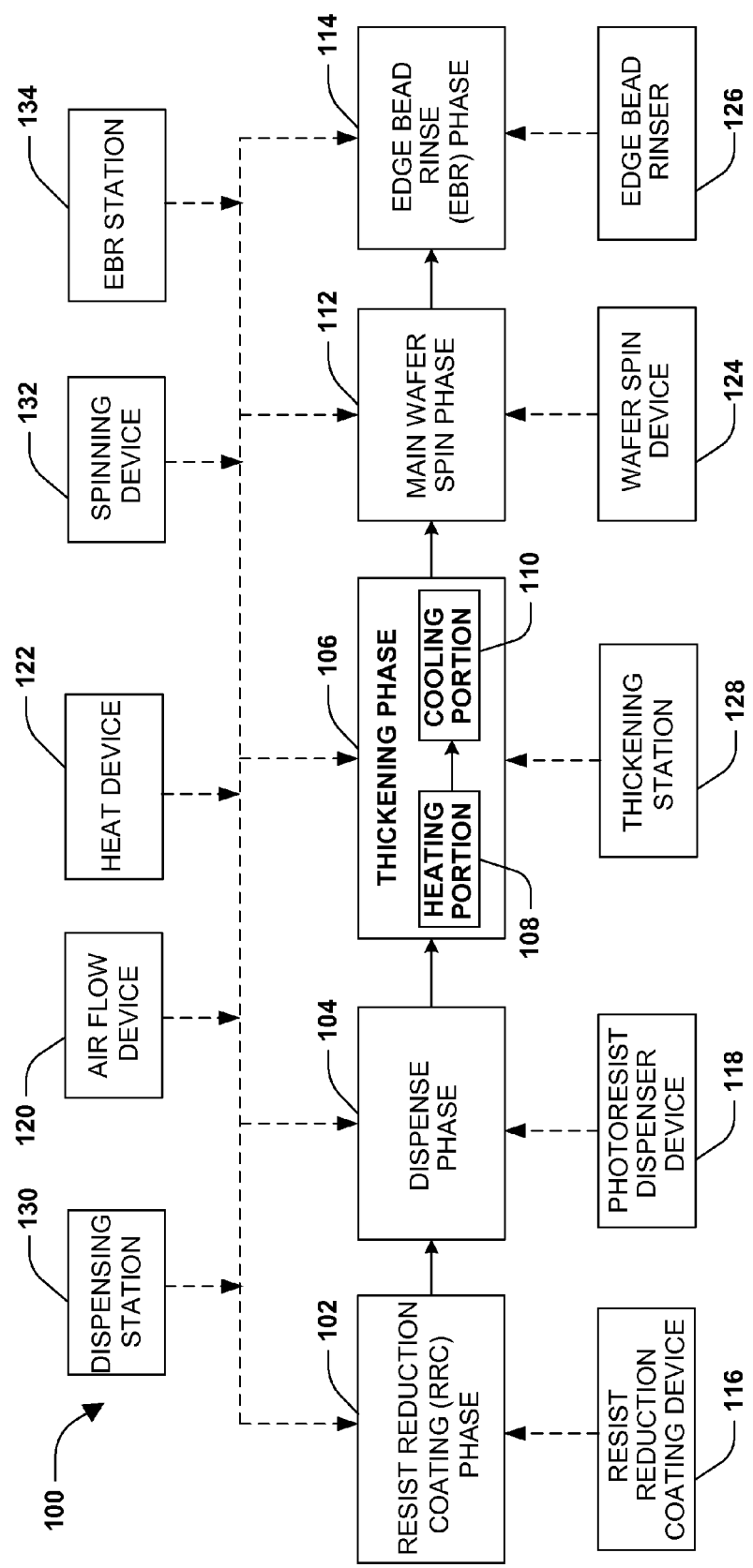
FIG. 1 is an illustration of a system configured for controlling thickness of photoresist during wafer processing, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

FIG. 1 illustrates a system 100 for controlling thickness of photoresist during wafer processing, according to some embodiments. The system 100 includes a thickening station 128 configured to perform a thickening phase 106. The thickening station 128 includes a heat device 122. In some embodiments, the thickening station 128 includes an air flow device 120 configured to supply air at a controlled temperature, such as a heating temperature or a cooling temperature, that is different than a wafer temperature of a wafer. In some embodiments, the air flow device 120 is incorporated with a dispensing station 130. The system 100 includes the dispensing station 130 configured to dispense material onto a surface of the wafer during a material dispense phase, such as a resist reduction coating (RRC) phase 102 of a first solvent, a dispense phase 104 of a photoresist material, or an edge bead rinse (EBR) phase 114 of a second solvent. In some embodiments, the dispensing station 130 includes a photoresist dispenser device 118 configured to dispense the photoresist material. The system 100 includes a spinning device 132 configured to spin the wafer during the material dispense phase. The system 100 includes an EBR station 134 including an edge bead rinser 126. In some embodiments, the system 100 includes at least one of a RRC device 116 configured to perform the RRC phase 102 or a wafer spin device 124 configured to perform a main wafer spin phase 112.

The system 100 is associated with a spin coat process that coats a wafer with photoresist during wafer processing, such as a lithography process used for semiconductor fabrication. The spin coat process includes one or more phases, such as the resist reduction coating (RRC) phase 102 performed by the resist reduction coating device 116, the dispense phase 104 performed by the photoresist dispenser device 118, the thickening phase 106 including a heating portion 108 and a cooling potion 110 that are performed by at least one of the air flow device 120 or the heat device 122, the main wafer spin phase 112 performed by the wafer spin device 124, or the edge bead rinse (EBR) phase 114 performed by the edge bead rinser 126. During the one or more phases, the air flow device 120 is configured to provide down flow air according to various air settings that specify air temperatures or flow speeds for the down flow air during respective phases. The heat device 122 is configured to provide heat according to various heat settings that specify heat temperatures for the heat during respective phases. In an example, the heat device 122 utilizes a heating mechanism, such as a hot-plate, to supply the heat.

In some embodiments of providing at least one of down flow air or heat during a spin coating cycle, the resist reduction coating device 116 is configured to dispense a solvent onto a surface of a wafer during the RRC phase 102. The solvent is used to wet the surface of the wafer before photoresist is dispensed onto the surface. In an example, the air flow device 120 is configured to supply the down flow air according to an RRC phase air setting during the RRC phase 102. The down flow air is supplied substantially towards a top portion of the wafer. In some embodiments, the down flow air is supplied at a baseline air temperature and a baseline flow speed. The baseline temperature can correspond to a normal air temperature and the baseline flow speed can correspond to a normal flow speed maintained within a spin coating chamber during various phases of the spin coating cycle. In an example, the baseline temperature corresponds to a temperature that does not substantially affect a viscosity of the photoresist, such as a temperature below 23 C, and the baseline flow speed corresponds to an air speed that does not substantially affect the viscosity of the photoresist. In another example, the baseline temperature or the baseline flow speed correspond to a power off setting for the air flow device 120. It is appreciated that the down flow air can be supplied at other air temperatures or flow speeds during the RRC phase 102. In another example, the heat device 122 is configured to supply the heat according to an RRC phase heat setting during the RRC phase 102. The heat is supplied substantially towards a bottom portion of the wafer. In some embodiments, the heat is supplied at a baseline heat temperature. The baseline heat temperature can correspond to a normal heat temperature maintained within the spin coating chamber during various phases of the spin coating cycle. In an example, the baseline heat temperature corresponds to temperature that does not substantially affect the viscosity of the photoresist such as a temperature below 23 C. In another example, the baseline heat temperature corresponds to a power off setting for the heat device 122. It is appreciated that the heat can be supplied at other heat temperatures during the RRC phase 102.

The photoresist dispenser device 118 is configured to dispense the photoresist onto the wafer during the dispense phase 104. During at least a portion of the dispense phase 104, the wafer is spun so that the photoresist is distributed across at least some of the surface of the wafer. In an example, the air flow device 120 is configured to supply the down flow air according to a dispense phase air setting during the dispense phase 104. The down flow air is supplied substantially towards the top portion of the wafer. In some embodiments, the down flow air is supplied at the baseline air temperature and the baseline flow speed. It is appreciated that the down flow air can be supplied at other air temperatures or flow speeds during the dispense phase 104, such as at an increased air temperature or an increased flow speed to promote dispersion of the photoresist across the wafer. In another example, the heat device 122 is configured to supply the heat according to a dispense phase heat setting during the dispense phase 104. The heat is supplied substantially towards the bottom portion of the wafer. In some embodiments, the heat is supplied at the baseline heat temperature. It is appreciated that the heat can be supplied at other heat temperatures during the dispense phase 104.

The thickening phase 106 is performed so that a thickness of the photoresist is increased before the main wafer spin phase 112 so that the wafer can be spun at a relatively lower speed during the main wafer spin phase 112 while still achieving a target thickness for the photoresist, such as a range of thicknesses between about 200 nm to about 1200 nm. For example, the down flow air and the heat are used to increase a vaporization factor of the photoresist. Increasing the vaporization factor results in an increased viscosity of the photoresist. A thickness of the photoresist is increased because of the increased viscosity. In this way, the wafer spin device 124 can rotate the wafer at relatively lower speeds, which can mitigate rotational instability issues resulting from tangential velocity along an edge of the wafer. In an example, the thickening phase 106 includes the heating portion 108, such as a heating phase, and the cooling portion 110, such as a cooling phase.

During the heating portion 108 of the thickening phase 106, the air flow device 120 is configured to supply the down flow air according to a first thickening phase air setting specifying at least one of an increased air temperature or an increased flow speed. The down flow air is supplied substantially towards the top portion of the wafer. In some embodiments, the down flow air is supplied at the increased air temperature that is relatively hotter than the baseline air temperature, such as a temperature that affects the viscosity of the photoresist. For example, the increased air temperature corresponds to a temperature above 22 C. The down flow air is supplied at the increased flow speed that is relatively faster than the baseline air speed, such as a speed that affects viscosity of the photoresist. The heat device 122 is configured to supply the heat according to a first thickening phase heat setting specifying an increased heat temperature. The heat is supplied substantially towards the bottom portion of the wafer. In some embodiments, the heat is supplied at the increased heat temperature that is relatively hotter than the baseline heat temperature, such as a temperature that affects the viscosity of the photoresist. For example, the increased heat temperature corresponds to a temperature above 22 C.

During the cooling portion 110 of the thickening phase 106, the air flow device 120 is configured to supply the down flow air according to a second thickening phase air setting. In an example, the second thickening phase air setting specifies at least one of the increased air temperature or the increased flow speed. In some embodiments, the down flow air is supplied at the increased air temperature that is relatively hotter than the baseline air temperature, and the down flow air is supplied at the increased flow speed that is relatively faster than the baseline air speed. In some embodiments, the second thickening phase air setting specifies at least one of the baseline air temperature or the baseline flow speed. The heat device 122 is configured to supply the heat according to a second thickening phase heat setting specifying the baseline heat temperature. The heat is supplied substantially towards the bottom portion of the wafer. In an example, the heat is supplied at the baseline heat temperature that is relatively cooler than the increased heat temperature. In another example, the heat device 122 is powered off to achieve the baseline heat temperature.

The wafer spin device 124 is configured to rotate the wafer according to a uniform thickness metric for the photoresist during the main wafer spin phase 112. For example, the wafer is rotated so that the photoresist is formed as a photoresist film, having a relatively uniform thickness, on top of the surface of the wafer. In an example, the air flow device 120 is configured to supply the down flow air according to a main wafer spin phase air setting during the main wafer spin phase 112. The down flow air is supplied substantially towards the top portion of the wafer. In some embodiments, the down flow air is supplied at the baseline temperature and the baseline flow speed. It is appreciated that the down flow air can be supplied at other temperatures or flow speeds during the main wafer spin phase 112, such as at an increased temperature or increased flow speed to promote thickening or dispersion of the photoresist across the wafer. In another example, the heat device 122 is configured to supply the heat according to a main wafer spin phase heat setting during the main wafer spin phase 112. The heat is supplied substantially towards the bottom portion of the wafer. In some embodiments, the heat is supplied at the baseline heat temperature. It is appreciated that the heat can be supplied at other heat temperatures during the main wafer spin phase 112 so that the photoresist is formed to a uniform target thickness.

The edge bead rinser 126 is configured to dispense solvent onto the wafer to wash out, such as remove, at least a portion of the photoresist along a wafer edge of the wafer during the EBR phase 114. In an example, the air flow device 120 is configured to supply the down flow air according to an EBR phase air setting during the EBR phase 114. The down flow air is supplied substantially towards the top portion of the wafer. In some embodiments, the down flow air is supplied at the baseline temperature and the baseline flow speed. It is appreciated that the down flow air can be supplied at other temperatures or flow speeds during the EBR phase 114. In another example, the heat device 122 is configured to supply the heat according to an EBR phase heat setting during the EBR phase 114. The heat is supplied substantially towards the bottom portion of the wafer. In some embodiments, the heat is supplied at the baseline heat temperature. It is appreciated that the heat can be supplied at other heat temperatures during the EBR phase 114. In this way, one or more settings are used to control temperature and down flow air during one or more phases of the spin coating process so that the photoresist is formed to a target thickness without the wafer spin device 124 having to rotate the wafer, such as a relatively large wafer, at a unstable speed to achieve the target thickness.

Figure 2:
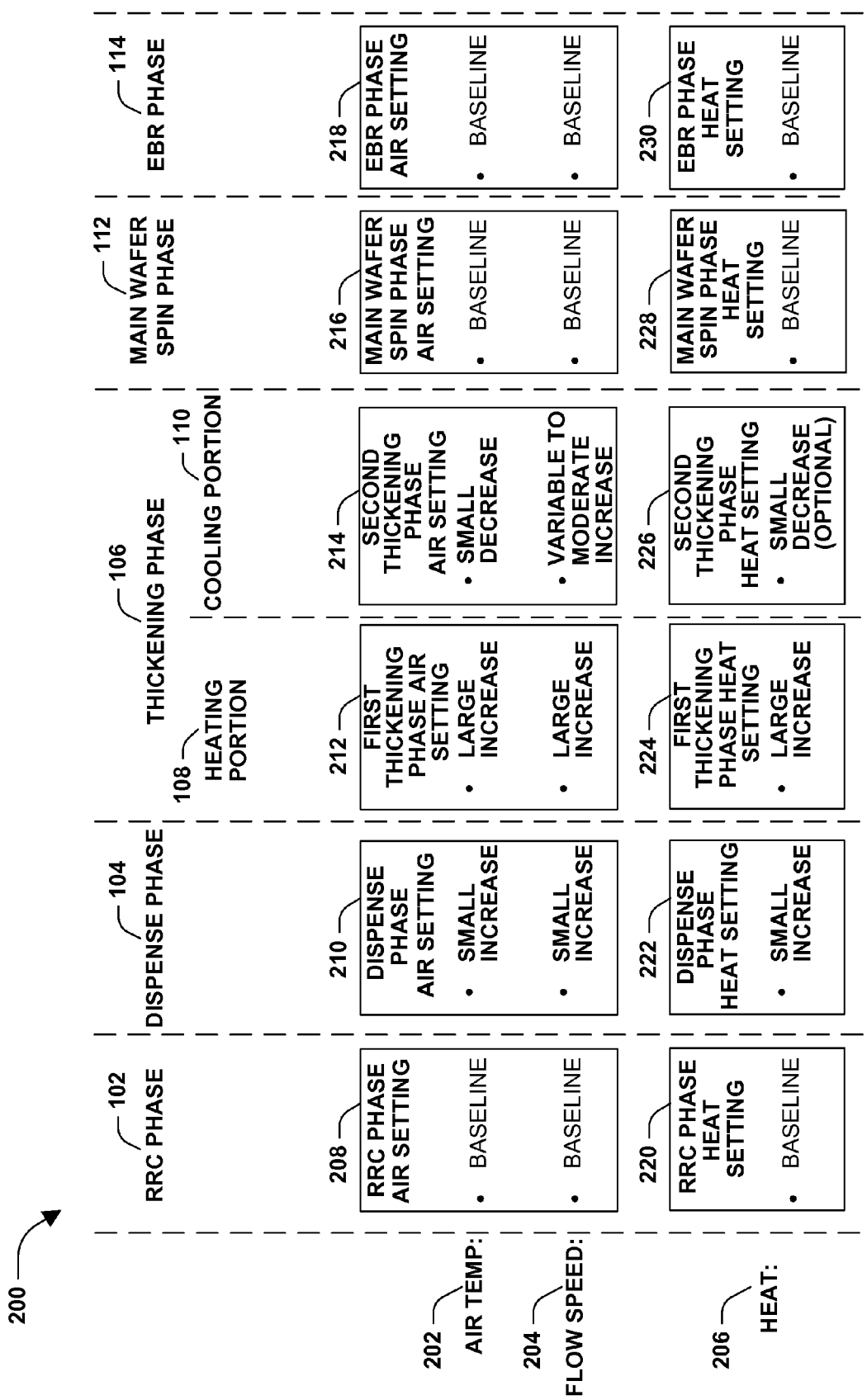
FIG. 2 is an illustration of one or more settings used to control temperature or down air flow during one or more phases of a spin control process, according to some embodiments.

FIG. 2 illustrates an example 200 of one or more settings used to control temperature or down air flow during one or more phases of a spin control process. The spin control process includes one or more phases, such as an RRC phase 102, a dispense phase 104, a thickening phase 106 including a heating portion 108 and a cooling portion 110, a main wafer spin phase 112, or a EBR phase 114. One or more air settings are used to specify values for air temperature 202 and flow speed 204 associated with down flow air that is supplied substantially towards a top portion of a wafer during the spin control process. One or more heat settings are used to specify values for a heat temperature 206 of heat that is supplied substantially towards a bottom portion of the wafer during the spin control process.

It is appreciated that a wide range of values for the air temperature 202, the flow speed 204, and the heat temperature 206 can be specified, and that merely a few values, such as a baseline value, a small increase value from the baseline value, a moderate increase value from the baseline value, a large increase from the baseline value, or a small decrease from the baseline value are used merely for illustrative ease.

In some embodiments, an RRC phase air setting 208, for the RRC phase 102, specifies that a baseline air temperature is to be used for the air temperature 202 associated with the down flow air, and that a baseline flow speed is to be used for the flow speed 204 associated with the down flow air. The baseline air temperature and the baseline flow speed can correspond to temperature and flow speeds that do not substantially affect a viscosity of the photoresist, such as a temperature below 23 C. An RRC phase heat setting 220, for the RRC phase 102, specifies that a baseline heat temperature is to be used for the heat temperature 206. The baseline heat temperature can correspond to a temperature that does not substantially affect the viscosity of the photoresist, such as a temperature below 23 C.

In some embodiments, a dispense phase air setting 210, for the dispense phase 104, specifies that a small increase over the baseline air temperature is to be used for the air temperature 202, and that a small increase over the baseline flow speed is to be used for the flow speed 204. The small increase in air temperature 202 and flow speed 204 can be specified so that the relatively high rotational speed of the wafer during the dispense phase 104 does not result in a relatively large loss in thickness of the photoresist, while still allowing the photoresist to disperse over a surface of the wafer. A dispense phase heat setting 222, for the dispense phase 104, specifies that a small increase over the baseline heat temperature is to be used for the heat temperature 206.

In some embodiments, a first thickening phase air setting 212, for the heating portion 108 of the thickening phase 106, specifies that a large increase over the baseline air temperature, such as a temperature that substantially affects viscosity of the photoresist such as a temperature over 22 C, is to be used for the air temperature 202, and that a large increase over the baseline flow speed is to be used for the flow speed 204. A first thickening phase heat setting 224, for the heating portion 108 of the thickening phase 106, specifies that a large increase over the baseline heat temperature, such as a temperature that substantially affects viscosity of the photoresist such as a temperature over 22 C, is to be used for the heat temperature 206. The large increase in air temperature 202, flow speed 204, and heat temperature 206 is specified so that a vaporization factor of the photoresist is increased. The increased vaporization factor results in an increased viscosity of the photoresist. A thickness of the photoresist is increased because of the increased viscosity. In this way, the wafer can be rotated at relatively lower speeds, which can mitigate rotational instability issues resulting from tangential velocity along an edge of the wafer.

In some embodiments, a second thickening phase air setting 214, for the cooling portion 110 of the thickening phase 106, specifies that a small decrease over the baseline air temperature is to be used for the air temperature 202, and that a moderate increase over the baseline flow speed is to be used for the flow speed 204. A second thickening phase heat setting 226, for the cooling portion 110 of the thickening phase 106, specifies that a small decrease over the base heat temperature is to be used for the heat temperature 206.

In some embodiments, a main wafer spin phase air setting 216, for the main wafer spin phase 112, specifies that the baseline air temperature is to be used for the air temperature 202, and that the baseline flow speed is to be used for the flow speed 204. A main wafer spin phase heat setting 228, for the main wafer spin phase 112, specifies that the baseline heat temperature is to be used for the heat 206. In this way, temperature and down flow air are controlled while the wafer is rotated so that the photoresist can disperse across the surface of the wafer according to a uniform target thickness.

In some embodiments, an EBR phase air setting 218, for the EBR phase 114, specifies that the baseline air temperature is to be used for the air temperature 202, and that the baseline flow speed is to be used for the flow speed 204. An EBR phase heat setting 230, for the EBR phase 218, specifies that the baseline heat temperature is to be used for the heat temperature 206. In this way, an air flow device 120 and a heat device 122 can utilize the one or more air settings and heat settings to control the air temperature 202, the flow speed 204, and the heat temperature 206 during one or more phases of the spin coating process.

Figure 3:
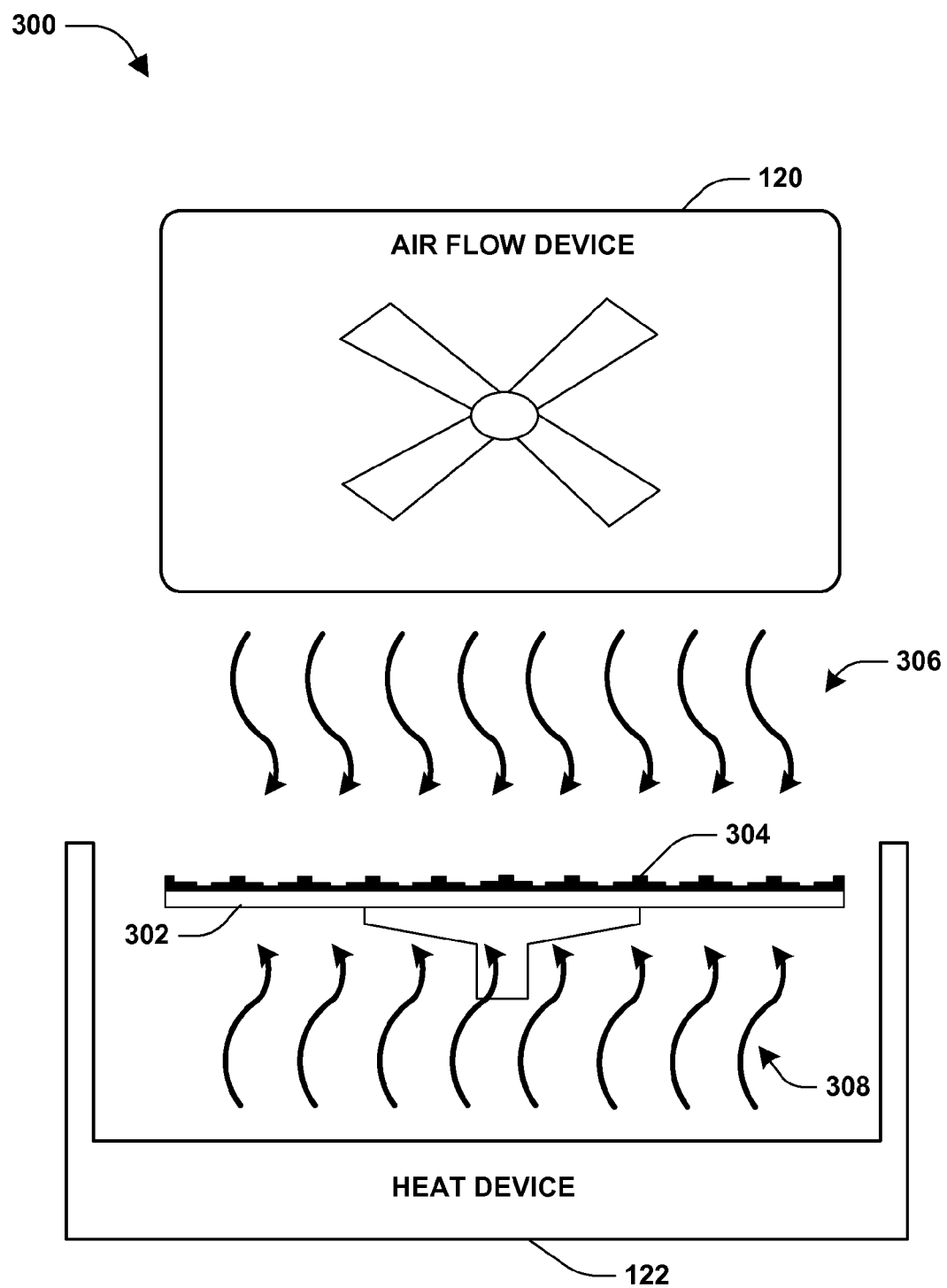
FIG. 3 is an illustration of a system configured for performing a spin coating process associated with a wafer, according to some embodiments.

FIG. 3 illustrates a system 300 for performing a spin coating process associated with a wafer 302, according to some embodiments. The system 300 includes an air flow device 120 and a heat device 122 that are configured to control, such as modify, heat 308 and down air flow 306 during the spin coating process including one or more phases, such as an RRC phase 102, a dispense phase 104, a thickening phase 106, a main wafer spin phase 112, or an EBR phase 114. In an example, the system 300 includes a thickening station 128 that includes the heat device 122, and optionally includes the air flow device 120 that can be associated with other devices, such as a dispensing station 130. The air flow device 120 is configured to supply the down air flow 306 substantially towards a top portion of the wafer 302, such as a surface of the wafer 302 including a photoresist 304. The heat device 122 is configured to supply heat 308 substantially towards a bottom portion of the wafer 302. In some embodiments, the system 300 includes at least one of the dispensing station 130 configured to dispense material onto a surface of the wafer during a material dispense phase, a spinning device 132 configured to spin the wafer during the material dispense phase, or an EBR station 134 configured to dispense a solvent onto the wafer to remove a portion of the material from the wafer.

In an example, during one or more phases, such as the dispense phase 104 occurring before the thickening phase 106, the air flow device 120 is configured to supply the down air flow 306 according to a baseline air temperature and a baseline flow speed. The air flow device 120 is configured to increase at least one of an air temperature 202 or a flow speed 204 of the down flow air 306 during a heating portion 108 of the thickening phase 106 according to a first thickening phase air setting 212. The increased air temperature 202 or the increased flow speed 204 can increase a vaporization factor of the photoresist 304 in order to increase a viscosity of the photoresist 304. In this way, the photoresist 304 becomes relatively thicker so that the main wafer spin phase 112, occurring after the thickening phase 106, can rotate the wafer 302 relatively slower while still achieving a target thickness. In an example, the heat device 122 is configured to increase the heat 308, such as a heat temperature 206 of the heat 308, according to a first thickening phase heat setting 224. The increased heat temperature can increase the vaporization factor of the photoresist 304, thus resulting in a relatively thicker photoresist 304.

Figure 4:
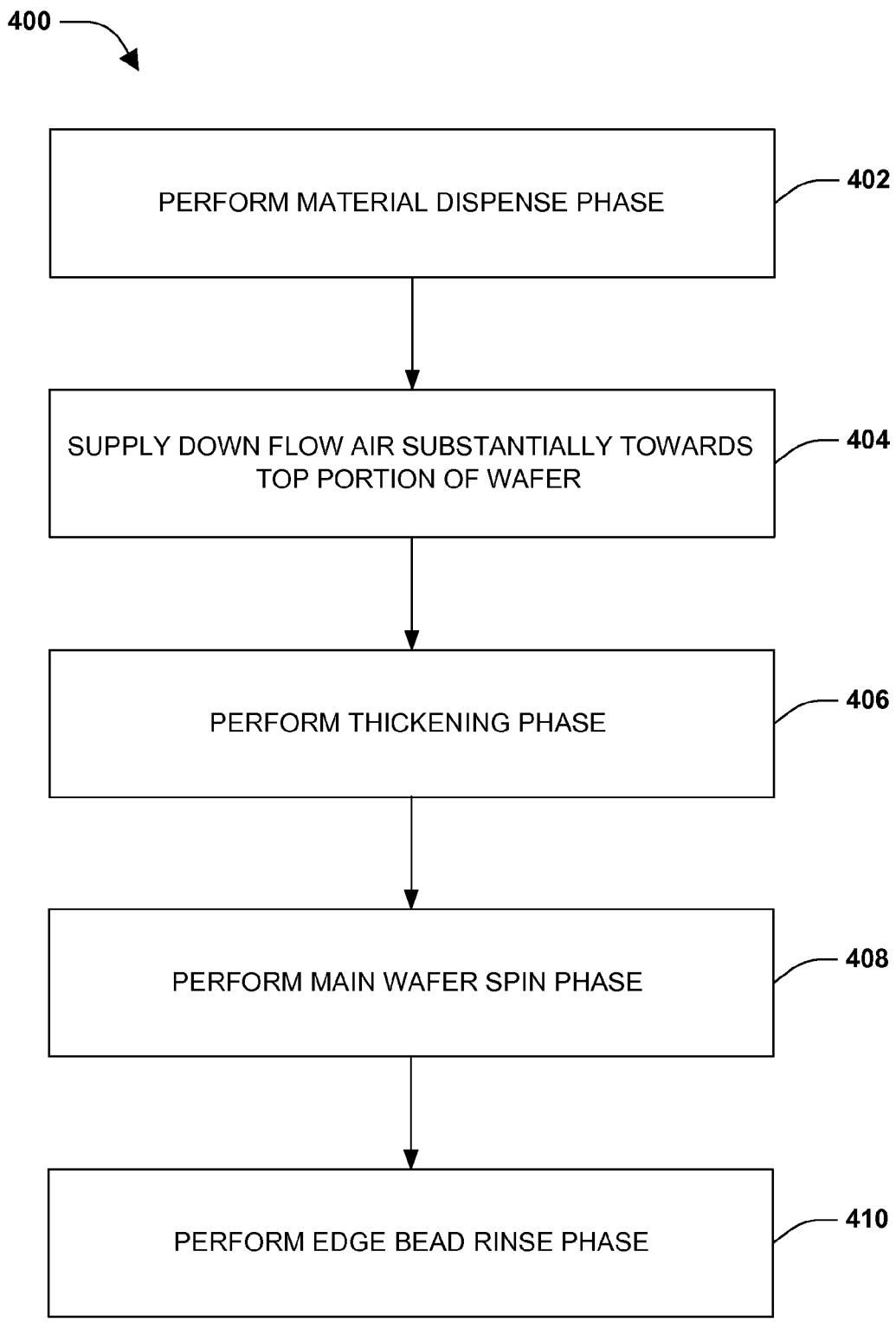
FIG. 4 is a flow diagram illustrating a method of performing a spin coating process associated with a wafer, according to some embodiments.

A method 400 of performing a spin coating process associated with a wafer 302, according to some embodiments, is illustrated in FIG. 4. At 402, a material dispense phase is performed to dispense a material, such as a photoresist, onto a surface of the wafer 302. At 404, down flow air 306 is supplied substantially towards a top portion of the wafer 302 during at least one of an RRC phase 102, a dispense phase 104, a main wafer spin phase 112, or an EBR phase 114. In an example, heat 308 is supplied substantially towards a bottom portion of the wafer 302 during at least one of the RRC phase 102, the dispense phase 104, the main wafer spin phase 112, or the EBR phase 114. In some embodiments, the wafer is moved from a dispensing station 130 to a thickening station 128 to perform a thickening phase. In some embodiments, the thickening phase is performed at the dispensing station 130. At 406, the thickening phase is performed. During the thickening phase at least one of an air temperature 202 or a flow speed 202 of the down flow air 306 is increased according to a first thickening phase air setting 212 during a heating portion 108 of a thickening phase 106. In some embodiments, a heat temperature 206 of the heat 308 is increased according to a first thickening phase heat setting 224 during the heating portion 108 of the thickening phase 106. In some embodiments, at least one of the heat temperature 206 of the heat 308, the air temperature 202 of the down flow air 306, or the flow speed 204 of the down flow air 306 is decreased based upon a second thickening phase air setting 214 or a second thickening phase heat setting 226 during a cooling portion 110 of the thickening phase 106. At 408, the main wafer spin phase is performed to rotate the wafer according to a uniform thickness metric. At 410, the EBR phase is performed to dispense a solvent onto the wafer to remove the portion of photoresist from the surface.

In some embodiments, air is supplied at a controlled temperature different than a wafer temperature of the wafer to change the wafer temperature to an ambient temperature for a main wafer spin phase performed after a cooling portion of the thickening phase. In some embodiments, the air temperature or the flow speed is modified during at least one of the RRC phase, the dispense phase, the main wafer spin phase, or the EBR phase.

Figure 5:
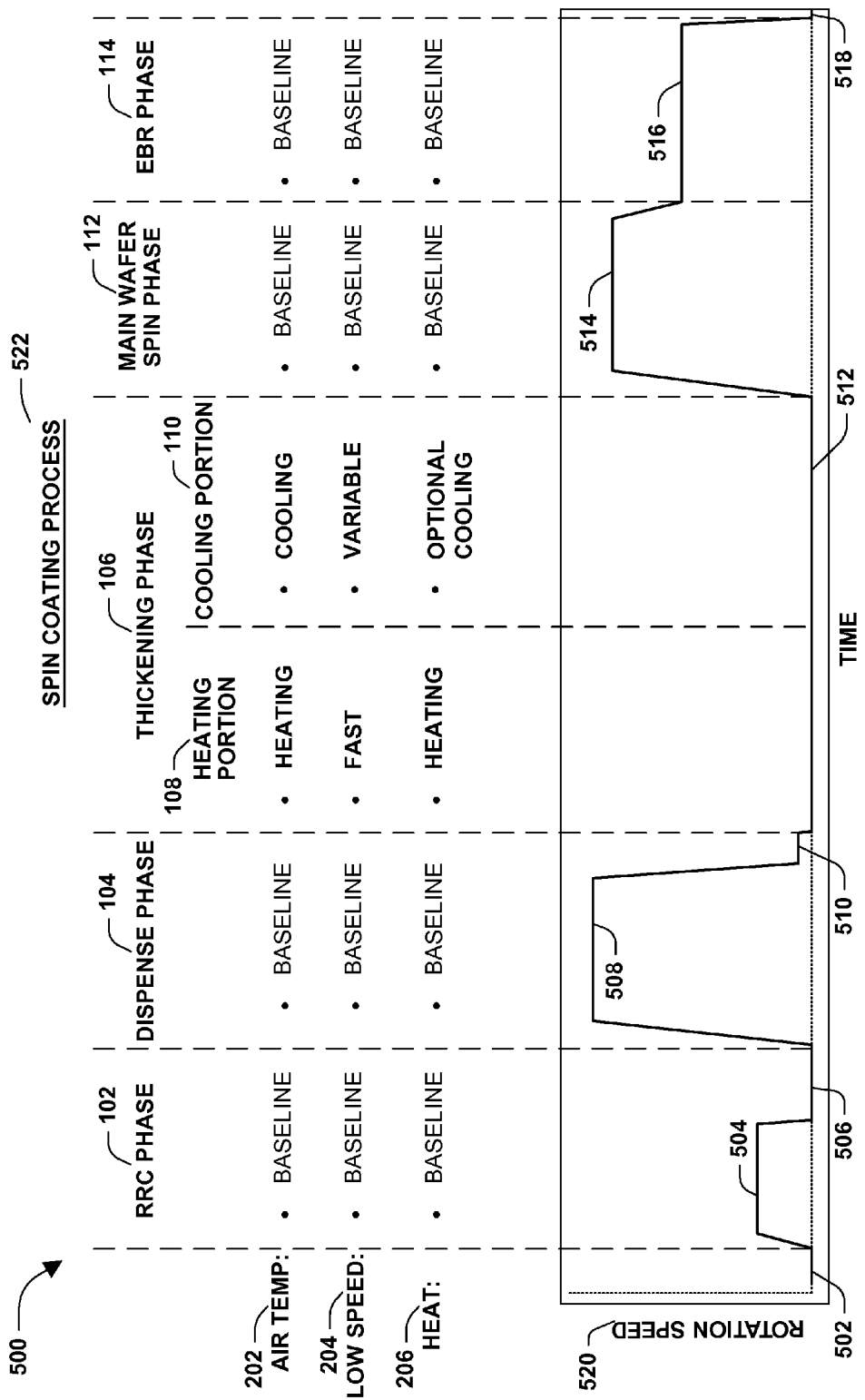
FIG. 5 is an illustration of a graph corresponding to rotational speed of a wafer during progress of a spin coating process, according to some embodiments.

FIG. 5 illustrates a graph 500 corresponding to rotational speed 520 of a wafer 302 during progress of a spin coating process 522. The spin coating process 522 includes one or more phases during which the wafer is either rotated or maintained at rest. During such phases, air temperature 202 of down air flow 306, flow speed 204 of down air flow 306, or heat temperature 2006 of heat 308 is controlled. In an example, the wafer 302 starts the spin coating process 522 at a first rotational speed 502, such as zero. During a first portion of an RRC phase 102, the wafer 302 is rotated at a second rotational speed 504. During a second portion of the RRC phase 102, the wafer 302 is rotated at a third rotational speed 506, such as zero. The air temperature 202, the flow speed 204, and the heat temperature 206 are maintained at baseline values during the RRC phase 102, such as at a temperature between about 22 C and about 23 C and an air flow speed between about 0.3 m/s and about 0.5 m/s. During a first portion of a dispense phase 104, the wafer 302 is rotated at a fourth rotational speed 508, such as at a relatively high rotational speed, so that photoresist 304 that is deposited on the wafer 302 can disperse across a surface of the wafer 302. During a second portion of the dispense phase 104, the wafer 302 is rotated at a fifth rotational speed 510 that is relatively slower than the fourth rotational speed 508. The air temperature 202, the flow speed 204, and the heat temperature 206 are maintained at baseline values during the dispense phase 104, such as at a temperature between about 22 C and about 23 C and an air flow speed between about 0.3 m/s and about 0.5 m/s.

During a heating portion 108 and a cooling portion 110 of a thickening phase 106, the wafer 302 is rotated at a sixth rotational speed 512, such as zero. During the heating portion 108, the air temperature 202 is increased to a heating temperature, such as between about 50 C and about 70 C, and, the flow speed 204 is increased to a fast speed, such as between about 0.6 m/s and about 1.0 m/s. The heat temperature 206 is increased to a heating temperature, such as between about 50 C and about 70 C. During the cooling portion 110, the air temperature 202 is decreased to a cooling temperature, such as between about 22 C and about 23 C. The flow speed 204 is variably controlled, such as between about 0.3 m/s and about 1.0 m/s. The heat temperature 206 is optionally decreased to between about 22 C and about 23 C. In this way, the photoresist 304 is thickened based upon increases in air flow or temperature associated with the thickening phase 106.

During a main wafer spin phase 112, the wafer 302 is rotated at a seventh rotational speed 514, such as at a relatively high rotational speed. The air temperature 202 is supplied at a baseline value, such as between about 22 C and about 23 C. The flow speed 204 is supplied at a baseline value, such as between about 0.3 m/s and about 0.5 m/s. The heat temperature 206 is supplied at a baseline value, such as between about 22 C and about 23 C. During an EBR phase 114, the wafer 302 is rotated at an eighth rotational speed 516. The air temperature 202, the flow speed 204, and the heat temperature 206 are maintained at baseline values during the EBR phase 114, such as at a temperature between about 22 C and about 23 C and an air flow speed between about 0.3 m/s and about 0.5 m/s. Once the spin coating process 522 is completed, the wafer 302 is brought to rest 518.

According to an aspect of the instant disclosure, a system for performing a spin coating process associated with a wafer is provided. The system includes a dispensing station that is configured to dispense material onto a surface of a wafer during a material dispense phase, such as an RRC phase of a first solvent, a dispense phase of a photoresist material, or an EBR phase of a second solvent. The system includes a spining device configured to spin the wafer during the material dispense phase. The system includes a thickening station. The thickening station includes a heat device configured to increase heat, such as a heat temperature, according to a first thickening phase heat setting. The heat is supplied substantially towards a bottom portion of the wafer during the heating portion of the thickening phase. In this way, a photoresist that is on top of a surface of the wafer is thickened due to an increase in viscosity resulting from vaporization caused by the increased down flow air or the increased heat. The system includes an EBR station configured to dispense a solvent onto the wafer to remove a portion of material from the surface.

According to an aspect of the instant disclosure, a system for controlling thickness of a photoresist during wafer processing is provided. The system includes an air flow device that is configured to supply down flow air, according to a dispense phase air setting, substantially towards a top portion of a wafer during a dispense phase that dispense the photoresist onto the wafer. The air flow device is configured to supply the down flow air according to a first thickening phase air setting specifying at least one of an increased air temperature or an increased flow speed. The down flow air is supplied substantially towards the top portion of the wafer during a heating portion of a thickening phase after the dispense phase and a before a main wafer spin phase. The system includes a heat device configured to supply heat, according to a dispense phase heat setting, substantially towards a bottom portion of the wafer during the dispense phase. The heat device is configured to supply the heat, according to a first thickening phase heat setting specifying an increased heat temperature, substantially towards the bottom portion of the wafer during the heating portion of the thickening phase. In this way, the photoresist that is on top of a surface of the wafer is thickened due to an increase in viscosity resulting from vaporization caused by the increased down flow air or the increased heat.

According to an aspect of the instant disclosure, a method for performing a spin coating process associated with a wafer is provided. The method includes performing a material dispense phase to dispense a material, such as a photoresist material, onto a surface of the wafer. In an example, the wafer is spun during the material dispense phase. Down flow air is supplied substantially towards a top portion of a wafer during at least one of an RRC phase of a first solvent, a dispense phase of a photoresist onto the wafer, a main wafer spin phase that rotates the wafer according to a uniform thickness metric, or an EBR phase of a second solvent to wash out at least a portion of the photoresist along a wafer edge of the wafer. A thickening phase is performed. At least one of an air temperature or a flow speed of the down flow air is increased according to a first thickening phase air setting during a heating portion of a thickening phase. In this way, the photoresist that is on top of a surface of the wafer is thickened due to an increase in viscosity resulting from vaporization caused by the increased down flow air or the increased heat. The main wafer spin phase is performed to rotate the wafer according to a uniform thickness metric. The EBR phase is performed to dispense the second solvent onto the wafer to remove the portion of the photoresist from the surface.

Figure 6:
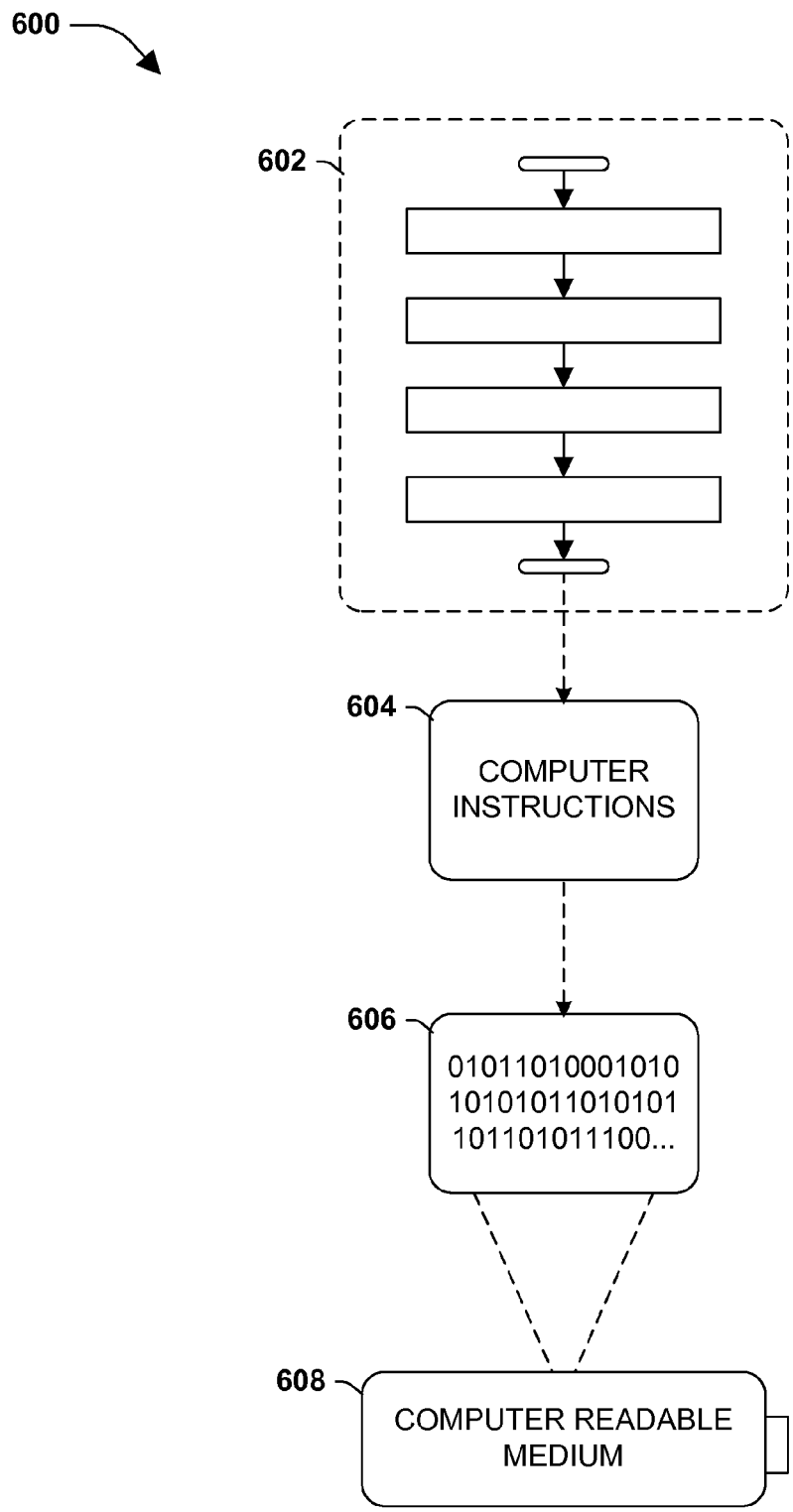
FIG. 6 is an illustration of an example computer-readable medium wherein processor-executable instructions configured to embody one or more of the provisions set forth herein may be comprised.

Still another embodiment involves a computer-readable medium comprising processor-executable instructions configured to implement one or more of the techniques presented herein. An example embodiment of a computer-readable medium or a computer-readable device that is devised in these ways is illustrated in FIG. 6, wherein the implementation 600 comprises a computer-readable medium 608, such as a CD-R, DVD-R, flash drive, a platter of a hard disk drive, etc., on which is encoded computer-readable data 606. This computer-readable data 606, such as binary data comprising at least one of a zero or a one, in turn comprises a set of computer instructions 604 configured to operate according to one or more of the principles set forth herein. In some embodiments, the processor-executable computer instructions 604 are configured to perform a method 602, such as at least some of the exemplary method 400 of FIG. 4, for example. In some embodiments, the processor-executable instructions 604 are configured to implement a system, such as at least some of the exemplary system 300 of FIG. 3, for example. Many such computer-readable media are devised by those of ordinary skill in the art that are configured to operate in accordance with the techniques presented herein.

As used in this application, the terms "component", "module," "system", "interface", and the like are generally intended to refer to a computer-related entity, either hardware, a combination of hardware and software, software, or software in execution. For example, a component includes a process running on a processor, a processor, an object, an executable, a thread of execution, a program, or a computer. By way of illustration, both an application running on a controller and the controller can be a component. One or more components residing within a process or thread of execution and a component is localized on one computer or distributed between two or more computers.

Furthermore, the claimed subject matter is implemented as a method, apparatus, or article of manufacture using standard programming or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, many modifications may be made to this configuration without departing from the scope or spirit of the claimed subject matter.

Figure 7:
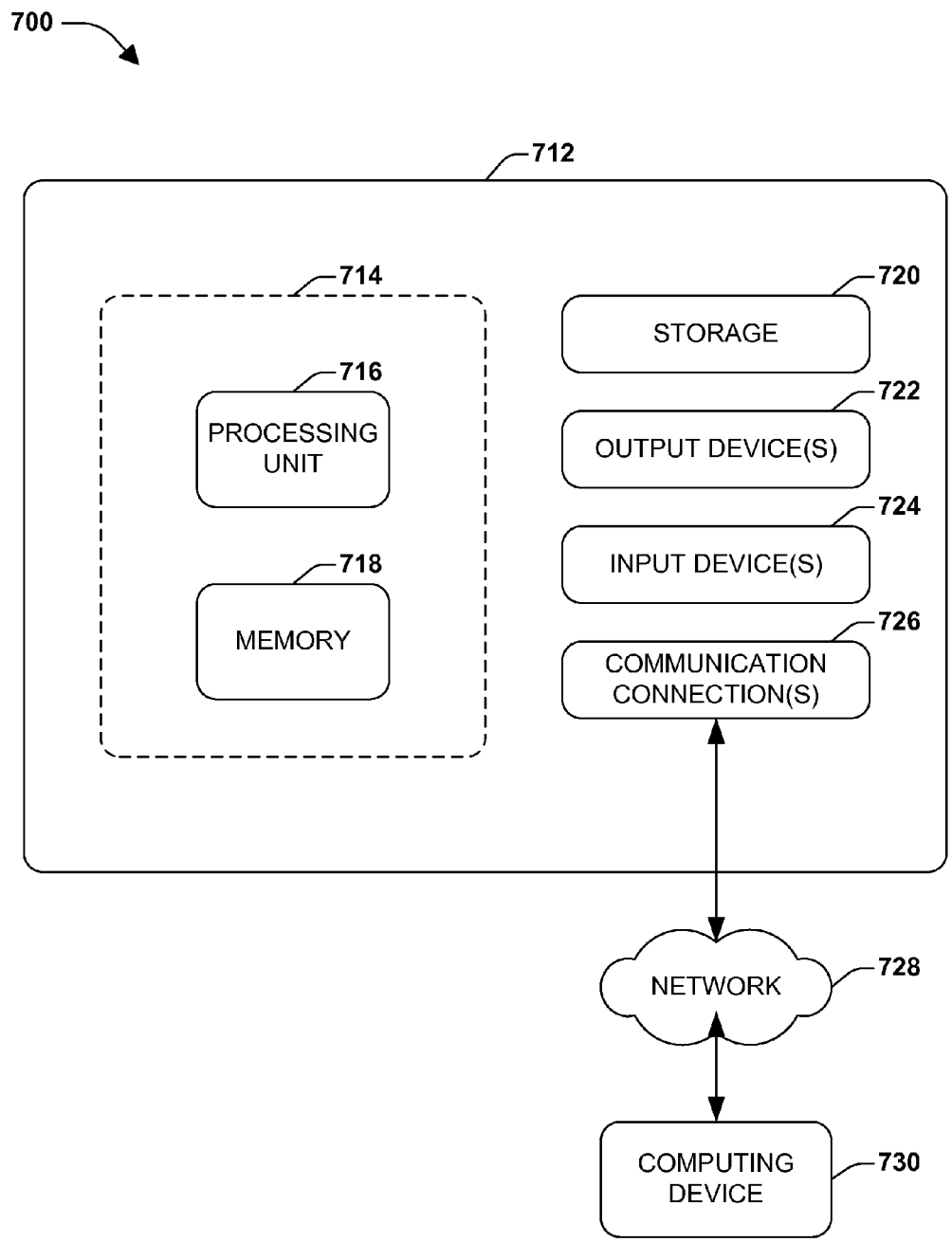
FIG. 7 illustrates an example computing environment wherein one or more of the provisions set forth herein may be implemented.

FIG. 7 and the following discussion provide a brief, general description of a suitable computing environment to implement embodiments of one or more of the provisions set forth herein. The operating environment of FIG. 7 is only one example of a suitable operating environment and is not intended to suggest any limitation as to the scope of use or functionality of the operating environment. Example computing devices include, but are not limited to, personal computers, server computers, hand-held or laptop devices, mobile devices, such as mobile phones, Personal Digital Assistants (PDAs), media players, and the like, multiprocessor systems, consumer electronics, mini computers, mainframe computers, distributed computing environments that include any of the above systems or devices, and the like.

Generally, embodiments are described in the general context of "computer readable instructions" being executed by one or more computing devices. Computer readable instructions are distributed via computer readable media as will be discussed below. Computer readable instructions are implemented as program modules, such as functions, objects, Application Programming Interfaces (APIs), data structures, and the like, that perform particular tasks or implement particular abstract data types. Typically, the functionality of the computer readable instructions are combined or distributed as desired in various environments.

FIG. 7 illustrates an example of a system 700 comprising a computing device 712 configured to implement one or more embodiments provided herein. In one configuration, computing device 712 includes at least one processing unit 716 and memory 718. In some embodiments, depending on the exact configuration and type of computing device, memory 718 is volatile, such as RAM, non-volatile, such as ROM, flash memory, etc., or some combination of the two. This configuration is illustrated in FIG. 7 by dashed line 714.

In other embodiments, device 712 includes additional features or functionality. For example, device 712 also includes additional storage such as removable storage or non-removable storage, including, but not limited to, magnetic storage, optical storage, and the like. Such additional storage is illustrated in FIG. 7 by storage 720. In some embodiments, computer readable instructions to implement one or more embodiments provided herein are in storage 720. Storage 720 also stores other computer readable instructions to implement an operating system, an application program, and the like. Computer readable instructions are loaded in memory 718 for execution by processing unit 716, for example.

The term "computer readable media" as used herein includes computer storage media. Computer storage media includes volatile and nonvolatile, removable and non-removable media implemented in any method or technology for storage of information such as computer readable instructions or other data. Memory 718 and storage 720 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by device 712. Any such computer storage media is part of device 712.

The term "computer readable media" includes communication media. Communication media typically embodies computer readable instructions or other data in a "modulated data signal" such as a carrier wave or other transport mechanism and includes any information delivery media. The term "modulated data signal" includes a signal that has one or more of its characteristics set or changed in such a manner as to encode information in the signal.

Device 712 includes input device(s) 724 such as keyboard, mouse, pen, voice input device, touch input device, infrared cameras, video input devices, or any other input device. Output device(s) 722 such as one or more displays, speakers, printers, or any other output device are also included in device 712. Input device(s) 724 and output device(s) 722 are connected to device 712 via a wired connection, wireless connection, or any combination thereof. In some embodiments, an input device or an output device from another computing device are used as input device(s) 724 or output device(s) 722 for computing device 712. Device 712 also includes communication connection(s) 726 to facilitate communications with one or more other devices.

Although the subject matter has been described in language specific to structural features and/or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

It will be appreciated that layers, features, elements, etc. depicted herein are illustrated with particular dimensions relative to one another, such as structural dimensions and/or orientations, for example, for purposes of simplicity and ease of understanding and that actual dimensions of the same differ substantially from that illustrated herein, in some embodiments. Additionally, a variety of techniques exist for forming the layers, features, elements, etc. mentioned herein, such as implanting techniques, doping techniques, spin-on techniques, sputtering techniques such as magnetron or ion beam sputtering, growth techniques, such as thermal growth and/or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims.

What is claimed is:

1. A method for performing a spin coating process associated with a wafer, comprising:
    performing a dispense phase to dispense a material onto a surface of a wafer, the performing a dispense phase comprising spinning the wafer;
    supplying down flow air substantially towards a top portion of the wafer during at least one of a resist reduction coating (RRC) phase of a first solvent, the dispense phase of the material onto the wafer, a main wafer spin phase that rotates the wafer according to a uniform thickness metric, or an edge bead rinse (EBR) phase of a second solvent to wash out at least a portion of the material along a wafer edge of the wafer;
    supplying heat substantially towards a bottom portion of the wafer during at least one of the RRC phase of the first solvent, the dispense phase of the material onto the wafer, the main wafer spin phase that rotates the wafer according to the uniform thickness metric, or the EBR phase of the second solvent to wash out at least the portion of the material along the wafer edge of the wafer;
    performing a thickening phase comprising increasing at least one of an air temperature or a flow speed of the down flow air according to a first thickening phase air setting during a heating portion of the thickening phase, wherein during the heating portion of the thickening phase the heat is increased according to a first thickening phase heat setting to increase a temperature of the wafer relative to a temperature of the wafer during the dispense phase;
    performing the main wafer spin phase after the thickening phase to rotate the wafer according to the uniform thickness metric; and
    performing the EBR phase to dispense the second solvent onto the wafer to remove the portion of the material from the wafer.

2. The method of claim 1, comprising:
    supplying air at a controlled temperature different than a wafer temperature of the wafer to change the wafer temperature to an ambient temperature for the main wafer spin phase performed after a cooling portion of the thickening phase.

3. The method of claim 1, comprising:
    modifying the flow speed of the down flow air during at least one of the RRC phase, the dispense phase, the main wafer spin phase, or the EBR phase.

4. The method of claim 1, comprising:
    responsive to completion of the dispense phase during which the material is dispensed onto the surface of the wafer, moving the wafer from a dispensing station to a thickening station for performance of the thickening phase.

5. The method of claim 1, comprising:
    responsive to completion of the dispense phase during which the material is dispensed onto the surface of the wafer, performing the thickening phase at a dispensing station.

6. The method of claim 1, comprising at least one of:
    decreasing at least one of the air temperature or the flow speed of the down flow air according to a second thickening phase air setting during a cooling portion of the thickening phase; or
    decreasing the heat according to a second thickening phase heat setting during the cooling portion of the thickening phase.

7. A method for performing a spin coating process associated with a wafer, comprising:
    during a dispense phase:
        dispensing a material onto a surface of a wafer while spinning the wafer;
    during a thickening phase after the dispense phase:
        heating the material during a first interval of time; and
        cooling the material during a second interval of time after the first interval of time, wherein the wafer is not spun during the heating and the cooling; and during a main wafer spin phase after the thickening phase:
        resuming spinning of the wafer until the material has a uniform thickness that corresponds to a uniform thickness metric.

8. The method of claim 7, wherein, during the dispense phase, air is applied to the material at a first flow speed.

9. The method of claim 8, wherein, during the heating, the air is applied to the material at a second flow speed.

10. The method of claim 9, wherein the second flow speed is greater than the first flow speed.

11. The method of claim 7, wherein:
    during the dispense phase, air is applied to the material at a first flow speed within a first range of flow speeds;
    during the heating, the air is applied to the material at a second flow speed within a second range of flow speeds; and
    during the cooling, the air is applied to the material at a third flow speed within at least one of the first range of flow speeds or the second range of flow speeds.

12. The method of claim 7, comprising:
    during a resist reduction coating (RRC) phase before the dispense phase:
        applying a first solvent to the surface of the wafer while spinning the wafer.

13. The method of claim 12, wherein the wafer is spun at a first speed during the RRC phase and at a second speed during the dispense phase, the second speed different than the first speed.

14. The method of claim 12, wherein the first speed is less than the second speed.

15. The method of claim 7, wherein the wafer is spun at a first speed during the dispense phase and at a second speed during the main wafer spin phase, the second speed different than the first speed.

16. The method of claim 15, wherein the second speed is less than the first speed.

17. The method of claim 7, comprising:
during an edge bead rinse (EBR) phase after the main wafer spin phase:
applying a second solvent to remove at least some of the material while spinning the wafer.

18. The method of claim 17, wherein the wafer is spun at a first speed during the dispense phase, a second speed during the main wafer spin phase, and a third speed during the EBR phase, the first speed faster than the second speed and the second speed faster than the third speed.

19. A method for performing a spin coating process associated with a wafer, comprising:
performing a first spin operation with respect to a wafer while dispensing a material onto a surface of the wafer and while applying air to the material at a first flow speed;
heating the material for a first interval of time while applying the air to the material at a second flow speed greater than the first flow speed; and
performing a second spin operation with respect to the wafer after the heating, the second spin operation spinning the wafer until the material has a uniform thickness that corresponds to a uniform thickness metric.

20. A method for performing a spin coating process associated with a wafer, comprising:
performing a dispense phase to dispense a material onto a surface of a wafer, the performing a dispense phase comprising spinning the wafer;
supplying down flow air substantially towards a top portion of the wafer during at least one of a resist reduction coating (RRC) phase of a first solvent, the dispense phase of the material onto the wafer, a main wafer spin phase that rotates the wafer according to a uniform thickness metric, or an edge bead rinse (EBR) phase of a second solvent to wash out at least a portion of the material along a wafer edge of the wafer;
performing a thickening phase comprising increasing at least one of an air temperature or a flow speed of the down flow air according to a first thickening phase air setting during a heating portion of the thickening phase, wherein during the heating portion of the thickening phase a temperature of the wafer is increased relative to a temperature of the wafer during the dispense phase;
performing the main wafer spin phase after the thickening phase to rotate the wafer according to the uniform thickness metric, the performing comprising:
supplying air at a controlled temperature different than a wafer temperature of the wafer to change the wafer temperature to an ambient temperature after a cooling portion of the thickening phase; and
performing the EBR phase to dispense the second solvent onto the wafer to remove the portion of the material from the wafer.

* * * * *